United States Patent
Hillman et al.

(10) Patent No.: US 6,562,708 B1
(45) Date of Patent: May 13, 2003

(54) METHOD FOR INCORPORATING SILICON INTO CVD METAL FILMS

(75) Inventors: Joseph T. Hillman, Scottsdale, AZ (US); Steven P. Caliendo, Gold Canyon, AZ (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/713,934

(22) Filed: Nov. 16, 2000

(51) Int. Cl.[7] .................. H01L 21/3205; H01L 21/4763
(52) U.S. Cl. .................. 438/592; 438/648; 438/658; 438/680; 438/685
(58) Field of Search .................. 438/584, 592, 438/648, 658, 680, 685; 257/761, 750

(56) References Cited

U.S. PATENT DOCUMENTS

| | | | |
|---|---|---|---|
| 5,919,531 A | | 7/1999 | Arkles et al. ................ 427/576 |
| 5,989,999 A | | 11/1999 | Levine et al. ................ 438/627 |
| 6,054,398 A | * | 4/2000 | Pramanick .................. 438/784 |
| 6,238,737 B1 | * | 5/2001 | Chan et al. ............. 427/255.18 |
| 6,284,655 B1 | * | 9/2001 | Marsh ........................ 438/681 |

FOREIGN PATENT DOCUMENTS

| | | | |
|---|---|---|---|
| EP | 0869544 A2 | 10/1998 | ......... H01L/21/285 |
| WO | WO 00/65640 | 11/2000 | ......... H01L/21/285 |

OTHER PUBLICATIONS

Harada et al., *Surface Modification of MOCVD–TiN Film by Plasma Treatment and SiH4 Exposure for Cu Interconnects*, Materials Research Society Conference Proceedings ULSI XIV, 1999.

Reid et al., *Thermodynamic Stability of Ta–Si/Cu Bilayers*, Materials Research Society Conference Proceedings ULSI–VII, 1992.

* cited by examiner

Primary Examiner—Olik Chaudhuri
Assistant Examiner—Hsien Ming Lee
(74) *Attorney, Agent, or Firm*—Wood, Herron & Evans, LLP

(57) ABSTRACT

A semiconductor device including a silicon-based substrate with recessed features and a tantalum barrier film having at least about 5% silicon incorporated substantially uniformly throughout the film. The device may further include a tantalum barrier film having improved conformality and decreased halogen impurity content. A method for incorporating the silicon into the tantalum barrier layer includes depositing tantalum by PECVD and interrupting deposition at least once to treat the deposited tantalum with a silane containing plasma.

24 Claims, No Drawings

METHOD FOR INCORPORATING SILICON INTO CVD METAL FILMS

FIELD OF THE INVENTION

This invention relates generally to methods of treating metal films deposited onto a substrate by chemical vapor deposition, and more specifically to a method of incorporating silicon into a tantalum film deposited by plasma enhanced chemical vapor deposition.

BACKGROUND OF THE INVENTION

In the formation of integrated circuits (IC), thin films containing metal and metalloid elements are deposited upon the surface of a semiconductor substrate or wafer. The films provide conductive and ohmic contacts in the circuits and between the various devices of an IC. For example, a thin film of a desired metal might be applied to the exposed surface of a contact or via in a semiconductor substrate. The film, passing through the insulative layers of the substrate, provides plugs of conductive material for the purpose of making interconnections across the insulating layers. One well-known process for depositing thin metal films is chemical vapor deposition (CVD). Another well-known process is physical vapor deposition (PVD), also referred to as sputtering.

In silicon-based integrated circuit technology, aluminum, copper, or tungsten may be used for interconnections and contacts. These conductor materials are typically deposited onto a diffusion barrier layer, such as TiN, Ta, TaN, and WN, which provide a barrier between the conductor and the silicon or silicon-based substrate. Copper as the conductor material is of particular interest due to its lower electrical resistivity and higher resistance to electromigration as compared to aluminum. However, copper has a high mobility and lifetime degradation in silicon, and will react to silicon at low annealing temperature. Thus, a high level of performance must be borne by diffusion barriers in copper metallizations of silicon.

It is generally believed that the addition of silicon to diffusion barrier layers, such as tantalum, improves the film's resistance to copper diffusion. It is believed that formation of silicides circumvents fast grain boundary diffusion of copper atoms through the barrier layers to the silicon substrate surface. In Harada et al., "Surface Modification of MOCVD-TiN Film by Plasma Treatment and $SiH_4$ Exposure for Cu Interconnects," Conference Proceedings ULSI XIV pp. 329–335 (1999 Materials Research Society), a method was proposed for incorporating silicon into a TiN barrier layer deposited by MOCD using TDMAT (tetrakis-dimethylamino-titanium). Plasma treatment alone was found to be ineffective for densifying the film, due to the plasma treatment process leaving the porous TiN film untreated on the sidewalls of substrate features. Likewise, a $SiH_4$ exposure alone was found to be ineffective in that it increased the via resistance to an unacceptable degree. The solution was found to be a plasma treatment of the TiN film followed by exposure to $SiH_4$ to achieve both high barrier performance on the sidewalls of substrate features and the low resistivity of the film. It was found that the anisotropic nature of the plasma treatment induced the self-aligned surface modification of TiN film during the $SiH_4$ exposure. It is noted that the method discussed in Harada et al. required a non-dense film in order to be effective. Further, if the TiN film was densified with a plasma anneal in an ammonia environment, then the thermal silane anneal was less effective due to most of the silicon being at the surface rather than penetrating to the bulk of the densified film. Moreover, Ti and TiN barrier layers are generally considered to be less effective as barriers to copper as compared to Ta and TaN barrier layers.

Sputtered tantalum (Ta) and reactive sputtered tantalum nitride (TaN) have been demonstrated to be good diffusion barriers between copper and a silicon-based substrate due to their high conductivity, high thermal stability and resistance to diffusion of foreign atoms. A discussion of the thermodynamic stability of Ta—Si/Cu bilayers may be found in Reid et al., "Thermodynamic Stability of Ta-Si/Cu Bilayers," Conference Proceedings ULSI-VII pp. 285–291 (1992 Materials Research Society) in which Ta—Si barrier layers were deposited onto silicon dioxide by physical vapor deposition (PVD) from a Ta—Si sputter target, followed by copper PVD. Reid et al. predicted the tantalum silicide compounds are stable with copper at room temperature, and assuming that finding also holds at higher temperatures, implied that copper will not react with any tantalum silicide during annealing on the basis of thermodynamics.

However, PVD-deposited Ta films inherently have poor step coverage due to shadowing effects. Thus, the sputtering process is limited to relatively large feature sizes (>0.3 $\mu$m) and small aspect ratio contact vias. CVD offers the inherent advantage over PVD of better con formality, even in small structures (<0.25 $\mu$m) with high aspect ratios. However, CVD of Ta with metal-organic sources such as tertbutylimidotris-diethylamido-tantalum (TBTDET), pentakis-dimethylamino-tantalum (PDMAT) and pentakis-dietlvllamiiino-tanitallllum (PDEAT) yields mixed results. An additional problem with MOCVD of Ta is that the resulting films have relatively high concentrations of oxygen and carbon impurities.

A process to deposit Ta at the relatively low temperatures used in PECVD (<500° C.) would provide an advantage in the formation of copper barriers in the next generation of IC. Ideally, the PECVD Ta film will have a high step coverage (the ratio of the coating thickness at the bottom of a feature to the thickness on the sides of a feature or on the top surface of the substrate or wafer adjacent the feature), good diffusion barrier properties, minimal impurities, low resistivity and good conformality (even coverage of complex topography of high aspect ratio features). Moreover, while Reid et al. recognized the effectiveness of amorphous silicides in tantalum diffusion barriers in the context of PVD, a method is needed for incorporating silicon into PECVD tantalum films used as barrier layers in copper metallization of silicon.

SUMMARY OF THE INVENTION

The present invention provides a method for treating a tantalum barrier film to incorporate silicon therein to provide a semiconductor device having improved diffusion barriers properties. To this end, the tantalum film is deposited by PECVD with periodic interruption of the deposition for a silane containing plasma treatment of the deposited film. In one example, a silicon-based substrate was fabricated having a tantalum barrier film on its surface and on the surfaces of a recessed feature with about 15% conformality and about 5% silicon incorporated substantially uniformly throughout the film.

DETAILED DESCRIPTION

There is provided a method for incorporating silicon into deposited PECVD-Ta films for the purpose of increasing the diffusion barrier property of the film with respect to copper metallization. In addition to the incorporation of silicon into the films, a decrease in halogen impurity content, particularly fluorine content of the film present when a fluoride precursor is used for the PECVD, is also observed and an improvement in con formality over the as deposited PECVD-Ta film is observed. To this end, and in accordance with the present invention, a multi-step exposure to a silane containing plasma is implemented to uniformly disperse silicon throughout the thickness of the PECVD-Ta film.

By way of example only, PECVD of Ta may be carried out using the method and apparatus disclosed in U.S. patent application Ser. No. 09/300,583 entitled "PECVD of Ta Films from Tantalum Halide Precursors", the drawings and detailed description of which are incorporated by reference herein. Numerous other apparatuses and methods for depositing tantalum by PECVD are available to one skilled in the art, and the present invention is not to be limited to any particular apparatus or method.

To illustrate an embodiment of the present invention, a 50 nm PECVD tantalum control film was deposited onto a silicon-based semiconductor substrate having recessed surface features with an aspect ratio of about 5 using the following deposition conditions:

TABLE 1

| Wafer Temperature | 350° C. |
|---|---|
| Susceptor Temperature | 396° C. |
| TaF$_5$ Precursor Flow | 30 sccm |
| Hydrogen Flow | 2 slm |
| Pressure | 2 torr |
| RF Power | 250 watts |

This baseline process is referred to as Process A. For Processes B, C and D, Process A was used, but interrupted periodically for a silane containing plasma treatment performed under the following conditions:

TABLE 2

| Wafer Temperature | 350° C. |
|---|---|
| Susceptor Temperature | 396° C. |
| Silane Flow | 100 sccm |
| Hydrogen Flow | 1.9 slm |
| Pressure | 2 torr |
| RF Power | 500 watts |

Each silane containing plasma treatment was performed for about 60 seconds. By way of example, the treatment may be performed for a period of about 10 seconds to about 2 minutes. At times less than about 10 seconds, insufficient silicon incorporation may occur, whereas at times greater than about 2 minutes the production time may become prohibitively long for practical purposes.

For Process B, a 25 nm PECVD-Ta film was deposited on the top surface of the substrate according to Process A and then interrupted for a silane containing plasma treatment under the above-described conditions. Then the remaining 25 nm of PECVD-Ta film was deposited using the above deposition conditions for a total of 50 nm on the top surface of the substrate, again followed by a final silane containing plasma treatment using the silane containing plasma treatment described above. Each series of deposition of tantalum film followed by silane containing plasma treatment is referred to as a deposition/anneal sequence. Thus, for Process B, there were two sets of deposition/anneal sequences in which each deposition step deposited 25 nm of tantalum film. For Process C, five sets of deposition/anneal sequences were performed, with each deposition step depositing a 10 nm thick tantalum film, for a total of 50 nm on the top surface of the substrate. For Process D, 10 sets of deposition/anneal sequences were performed, with each deposition step depositing a 5 nm thick tantalum film, for a total of 50 nm on the top of surface of the substrate. The number of sequences for each process and the PECVD-Ta film thickness per sequence are summarized in the table below:

TABLE 3

| Process | Number of Sequences | Ta thickness per sequence |
|---|---|---|
| A. | Control | 50 nm |
| B. | 2 | 25 nm |
| C. | 5 | 10 nm |
| D. | 10 | 5 nm |

Following film deposition, the deposited and treated films were characterized for fluorine content and for silicon content using nuclear reaction analysis (NRA) and Rutherford back scatter spectroscopy (RBS), respectively. The results of the characterization are summarized below:

TABLE 4

| Process | Number of Sequences | Silicon Content | Fluorine Content |
|---|---|---|---|
| A. | Control | not detected | 3.2% |
| B. | 2 | 5% | 1.9% |
| C. | 5 | 23% | 2.2% |
| D. | 10 | 22% | 2.2% |

No silicon was detected in the control film as expected. Process B led to 5% silicon incorporation throughout the tantalum film, while Processes C and D led to more than 20% silicon incorporation into the film. This implies that a single plasma anneal step is effective for significant silicon incorporation up to a certain thickness of tantalum film, but decreases in effectiveness as the tantalum film thickness is increased. Thus, deposition may be performed with silane containing plasma treatment interruption when the thickness has reached about 25 nm or less for at least 5% silicon incorporation throughout a tantalum film, or deposition may be performed with silane containing plasma treatment interruption when the thickness has reached about 10 nm or less for the higher amount of at least about 20% silicon incorporation throughout a tantalum film. It should thus be appreciated that the thickness at which the tantalum deposition is interrupted is determined by one skilled in the art by the total amount of silicon desired in the total tantalum film.

There was also a significant reduction in the fluorine content of the films that received the silane containing plasma treatment. More specifically, at least about 30% reduction in fluorine content was achieved in each treated film. In general, the silane containing plasma treatment will have the greatest impact on halogen impurity reduction when the halogen used as the deposition precursor is fluorine. This is due to the high volatility of SiF. Other halogens, in particular chlorine, bromine and iodine, do not exhibit such high volatility with silicon, and thus the halogen impurity reduction will be less pronounced or even non-existent. Furthermore, the halogen impurity reduction is dependent upon the amount of halogen impurity originally incorporated into the film due to the particular deposition parameters used. Process A resulted in 3.2% fluorine content, but other deposition parameters and halogens may exhibit greater or lesser amounts. In general, however, halogen impurities are typically present in Ta in a range up to about 5%, and the plasma treatment discussed herein is capable of achieving a reduction in that percentage. For example, a reduction of at least about 20% may be experienced in the case of fluorine.

Moreover, the plasma treatment improved the sidewall coverage and thus conformality of the film, with this effect being summarized in the table below:

TABLE 5

| Process | Sidewall Coverage | Bottom Coverage |
|---|---|---|
| Control | 5% | 32% |
| Silane Annealed | 19% | 28% |

While PVD and PECVD typically achieve only 5–10% conformality, a PECVD Ta film subjected to the silane containing plasma treatment discussed herein exhibits at least about 15% conformality, for example, about 19% achieved in the above example.

The Ta—Si barrier layer films formed by the method of the present invention may then be coated with a copper seed layer, in accordance with known techniques.

While an embodiment of the present invention was described using specific deposition and plasma treatment parameters, it is to be understood that these parameters may be varied in accordance with the knowledge of one of ordinary skill in the art of CVD. By way of further example and not limitation, the deposition conditions may be approximately as follows:

TABLE 6

| Wafer Temperature | 300–500° C. |
|---|---|
| Susceptor Temperature | 350–550° C. |
| $TaX_n$ Precursor Flow | 1–50 sccm |
| Hydrogen Flow | 0.1–10 slm |
| Pressure | 0.1–5 torr |
| RF Power | 100–1000 watts |

$TaX_n$ refers to a tantalum halide precursor, where X is a halogen, such as fluorine, chlorine, bromine and iodine, and n is an integer generally between 1 and 5. Also by way of example and not limitation, the silane containing plasma treatment conditions may be approximately as follows:

TABLE 7

| Wafer Temperature | 300–500° C. |
|---|---|
| Susceptor Temperature | 350–550° C. |
| Silane Flow | 10–1000 sccm |
| Hydrogen Flow | 0.1–10 slm |
| Pressure | 0.1–5 torr |
| RF Power | 100–1000 watts |
| Treatment Time | 10–120 seconds |

While the present invention has been illustrated by the description of an embodiment thereof, and while the embodiment has been described in considerable detail, it is not intended to restrict or in any way limit the scope of the appended claims to such detail. Additional advantages and modifications will readily appear to those skilled in the art. The invention in its broader aspects is therefore not limited to the specific details, representative apparatus and method and illustrative examples shown and described. Accordingly, departures may be made from such details without departing from the scope or spirit of applicant's general inventive concept.

What is claimed is:

1. A method for incorporating silicon into a tantalum film of desired total thickness comprising depositing tantalum by plasma enhanced CVD to a desired film thickness and interrupting said depositing at least once, prior to reaching said desired total thickness, to treat the deposited tantalum with a silane containing plasma to incorporate silicon into the deposited tantalum, and repeating said depositing and treating steps until reaching said desired total thickness.

2. The method of claim 1, wherein said depositing is interrupted after about every 25 nm of tantalum is deposited.

3. The method of claim 1, wherein said depositing is interrupted after about every 10 nm of tantalum is deposited.

4. The method of claim 1, wherein said depositing is interrupted after about every 5 nm of tantalum is deposited.

5. The method of claim 1, wherein each plasma treatment is for a time sufficient to incorporate at least about 5% silicon substantially throughout the previously deposited tantalum.

6. The method of claim 1, wherein the tantalum is deposited onto a silicon-based substrate having at least one recessed surface feature.

7. The method of claim 6 further comprising depositing a copper metallization layer on the deposited and treated tantalum.

8. The method of claim 6, wherein the plasma treatment increases the conformality of the tantalum deposited in the recessed surface feature.

9. The method of claim 8, wherein the plasma treatment increases the conformality to at least about 15%.

10. The method of claim 1, wherein the plasma treatment decreases a halogen impurity content in the deposited tantalum.

11. The method of claim 10, wherein the halogen is fluorine and the content is decreased by at least about 20%.

12. A method for incorporating silicon into a tantalum film deposited by plasma enhanced CVD, the method comprising:

depositing tantalum by plasma enhanced CVD to a desired thickness;

thereafter treating the deposited tantalum with a silane containing plasma to incorporate silicon into the deposited tantalum; and repeating the depositing and treating at least once to form a tantalum barrier film of desired total thickness, wherein the tantalum barrier film comprises at least about 5% silicon.

13. The method of claim 12, wherein each depositing forms a tantalum layer of no more than about 25 nm thickness.

14. The method of claim 12, wherein each depositing forms a tantalum layer of no more than about 10 nm thickness.

15. The method of claim 12, wherein the tantalum is deposited onto a silicon-based substrate having at least one recessed surface feature.

16. The method of claim 15 further comprising depositing a copper metallization layer on the tantalum barrier film.

17. The method of claim 15, wherein the plasma treatment increases the conformality of the tantalum deposited in the recessed surface feature.

18. The method of claim 17, wherein the plasma treatment increases the conformality to at least about 15%.

19. The method of claim 12, wherein the plasma treatment decreases a halogen impurity content in the deposited tantalum.

20. The method of claim 19, wherein the halogen is fluorine and the content is decreased by at least about 20%.

21. A method for incorporating silicon into a tantalum film deposited by plasma enhanced CVD, the method comprising:

depositing a tantalum layer up to about 25 nm thick onto a silicon-based substrate having at least one recessed surface feature by plasma enhanced CVD using a tantalum fluoride percursor;

thereafter treating the deposited tantalum layer with a silane containing plasma to incorporate silicon into the deposited tantalum layer and to decrease a content of fluorine impurity in the deposited tantalum layer by at least about 20%;

repeating the depositing and treating at least once to form a tantalum barrier film of desired total thickness, wherein the tantalum barrier film comprises at least about 5% silicon; and depositing a copper metallization layer onto the tantalum barrier film.

22. The method of claim 21, wherein the depositing of the tantalum layer is up to about 10 nm thick.

23. The method of claim 21, wherein the plasma treatment increases the conformality of the tantalum layer deposited in the recessed surface feature.

24. The method of claim 23, wherein the plasma treatment increases the conformality to at least about 15%.

* * * * *

UNITED STATES PATENT AND TRADEMARK OFFICE
CERTIFICATE OF CORRECTION

PATENT NO.    : 6,562,708 B1
DATED         : May 13, 2003
INVENTOR(S)   : Hillman et al.

It is certified that error appears in the above-identified patent and that said Letters Patent is hereby corrected as shown below:

Column 2,
Line 26, reads "con formality" and should read -- conformality --.
Line 31, reads "dietlvllamiiino-tanitallllum" and should read
-- dimethylamino-tantalum--.

Column 3,
Line 5, reads "con formality" and should read -- conformality --.

Signed and Sealed this

Fourth Day of November, 2003

JAMES E. ROGAN
*Director of the United States Patent and Trademark Office*